(12) United States Patent
Varma et al.

(10) Patent No.: US 7,236,117 B1
(45) Date of Patent: Jun. 26, 2007

(54) APPARATUS AND METHOD FOR PING-PONG MISMATCH CORRECTION

(75) Inventors: Seema Varma, Sunnyvale, CA (US); Ha Chu Vu, San Jose, CA (US); Kunhong Qu, Saratoga, CA (US); William David Llewellyn, San Jose, CA (US); Chungwai Benedict Ng, San Francisco, CA (US); Nghiem Nguyen, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 155 days.

(21) Appl. No.: 10/894,982

(22) Filed: Jul. 20, 2004

(51) Int. Cl.
*H03M 1/12* (2006.01)
(52) U.S. Cl. ...................... 341/155; 341/122
(58) Field of Classification Search ............ 341/155, 341/120, 118, 122, 144, 139; 348/241
See application file for complete search history.

(56) References Cited

U.S. PATENT DOCUMENTS

| | | | | |
|---|---|---|---|---|
| 4,591,832 A * | 5/1986 | Fling et al. | ............ | 341/141 |
| 6,018,364 A * | 1/2000 | Mangelsdorf | ............ | 348/241 |
| 6,081,215 A * | 6/2000 | Kost et al. | ............ | 341/120 |
| 6,342,919 B2 * | 1/2002 | Opris | ............ | 348/241 |
| 6,498,530 B1 * | 12/2002 | Tang | ............ | 330/9 |
| 6,587,143 B1 | 7/2003 | Boisvert | | |
| 6,771,198 B2 * | 8/2004 | Azadet | ............ | 341/110 |
| 6,900,750 B1 * | 5/2005 | Nairn | ............ | 341/118 |
| 7,075,471 B1 * | 7/2006 | Gupta | ............ | 341/155 |

* cited by examiner

*Primary Examiner*—Peguy JeanPierre
(74) *Attorney, Agent, or Firm*—Darby & Darby P.C.; Matthew M. Gaffney

(57) ABSTRACT

An analog front-end (AFE) circuit may include a correlated double sampler (CDS) with a ping-pong architecture, and a ping-pong mismatch correction circuit. The CDS employs a ping data path during ping phases, and employs a pong data path during pong phases. The ping-pong mismatch correction circuit is arranged to correct a mismatch between a gain that is associated with the ping data path and a gain that is associated with the pong data path. Further, the ping-pong mismatch correction circuit is arranged to correct a mismatch between an offset that is associated with the ping data path and an offset that is associated with the pong data path.

21 Claims, 9 Drawing Sheets

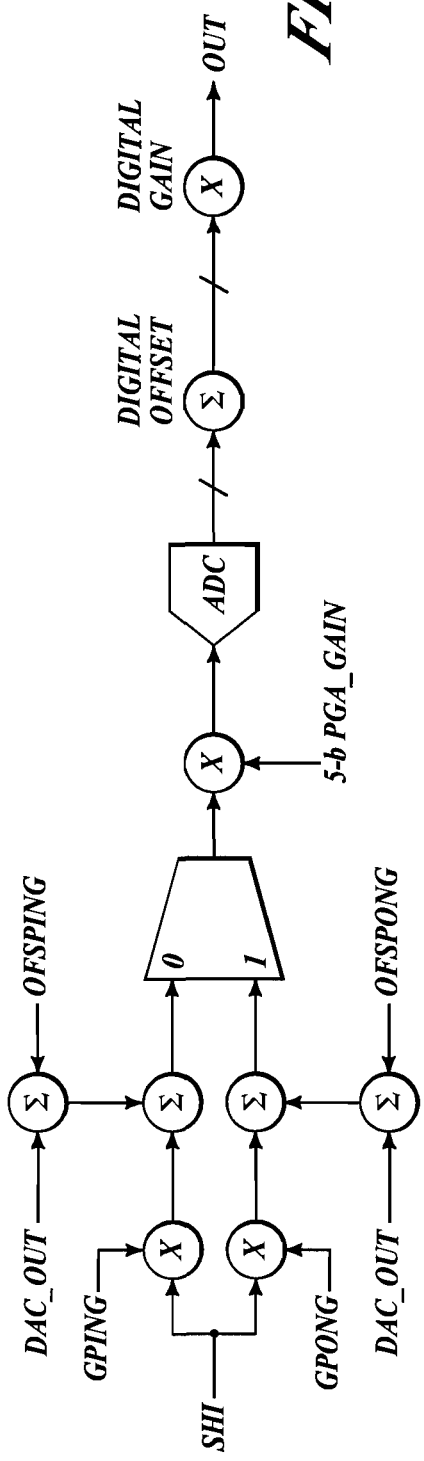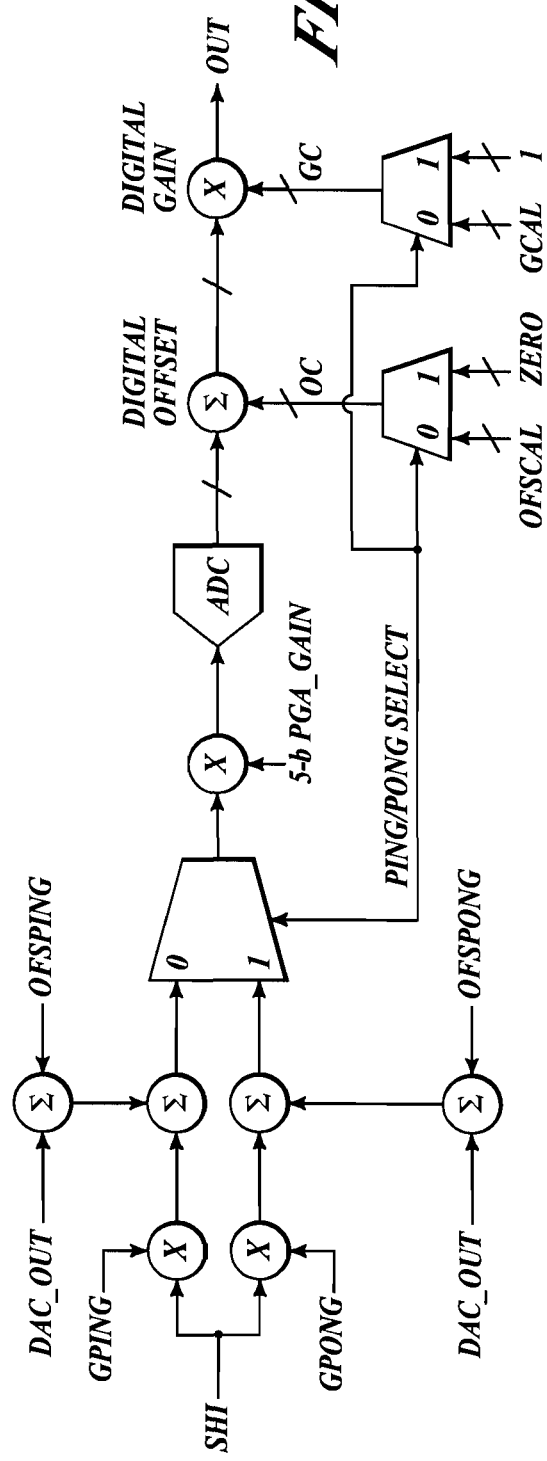

APPARATUS AND METHOD FOR PING-PONG MISMATCH CORRECTION

FIELD OF THE INVENTION

The invention is related to digital imaging systems, and, in particular, to a circuit for ping-pong mismatch correction.

BACKGROUND OF THE INVENTION

Digital imaging systems, such as copiers, facsimile machines, and scanners have become commonplace. Such systems scan an image into an analog signal, and convert the analog signal into a digital signal for processing or storage. This analog to digital conversion takes place in a digitizing channel of the system. Typically, an analog front end (AFE) circuit is employed in the digitizing channel, for amplifying and digitizing the analog signal. AFEs often include circuitry for gain calibration, in addition to converting the analog signal into a digital signal. Gain calibration may be employed to (a) match the level of the incoming analog signal to the available dynamic range of the digitizing channel to achieve improved signal-to-noise ratio (SNR), and (b) in color systems, to balance the relative levels of the red, green, and blue (RGB) digitizing channels for proper color interpretation.

BRIEF DESCRIPTION OF THE DRAWING

Non-limiting and non-exhaustive embodiments of the present invention are described with reference to the following drawings, in which:

FIG. 2A illustrates a functional block diagram an AFE circuit without ping-pong mismatch correction;

FIG. 2B illustrates a functional block diagram of an embodiment of an AFE circuit with ping-pong mismatch correction;

Figure 3:
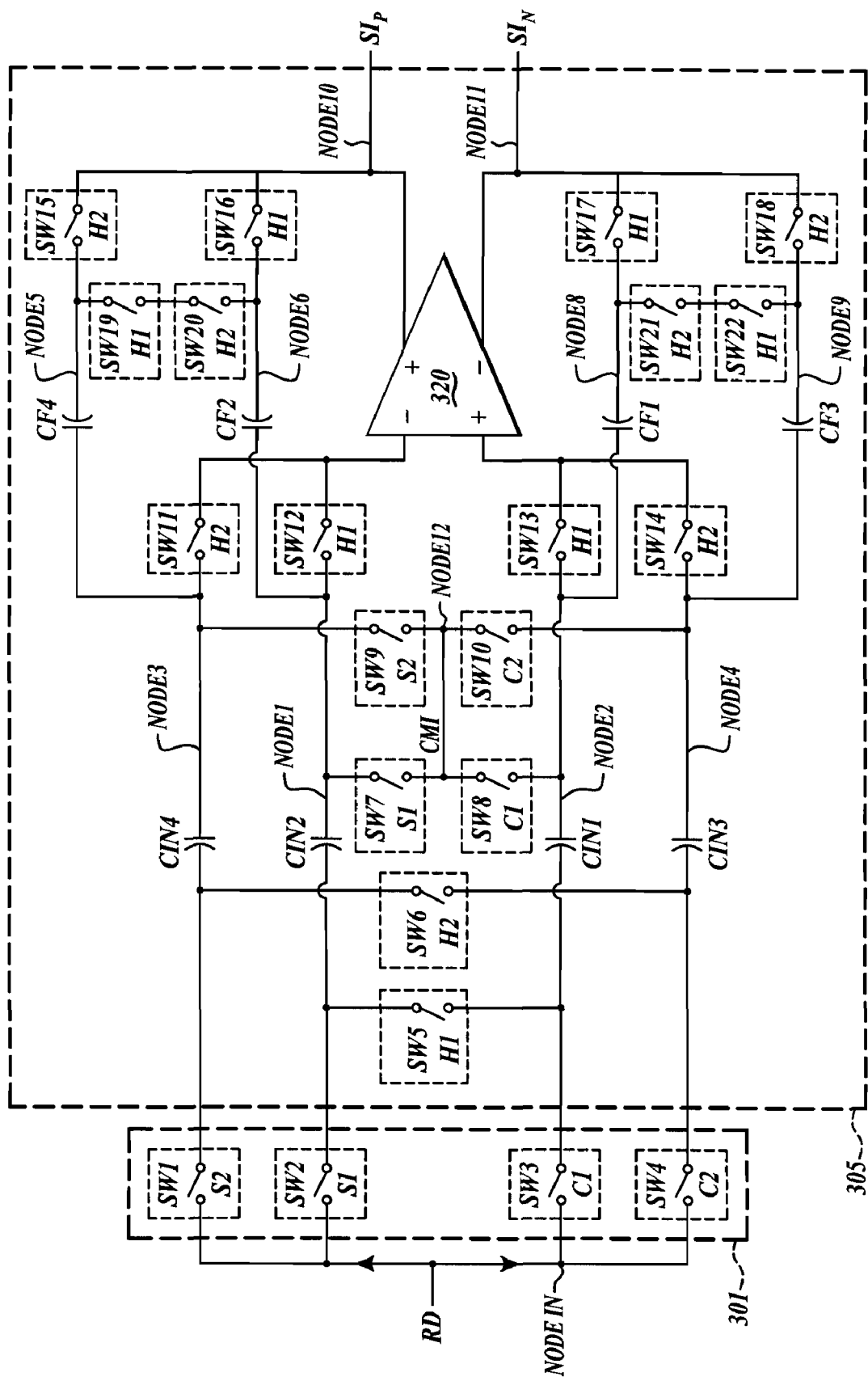
FIG. 3 schematically illustrates an embodiment of a correlated double sampler circuit which is an embodiment of the sample-and-hold circuit of FIG. 1.
Figure 11:
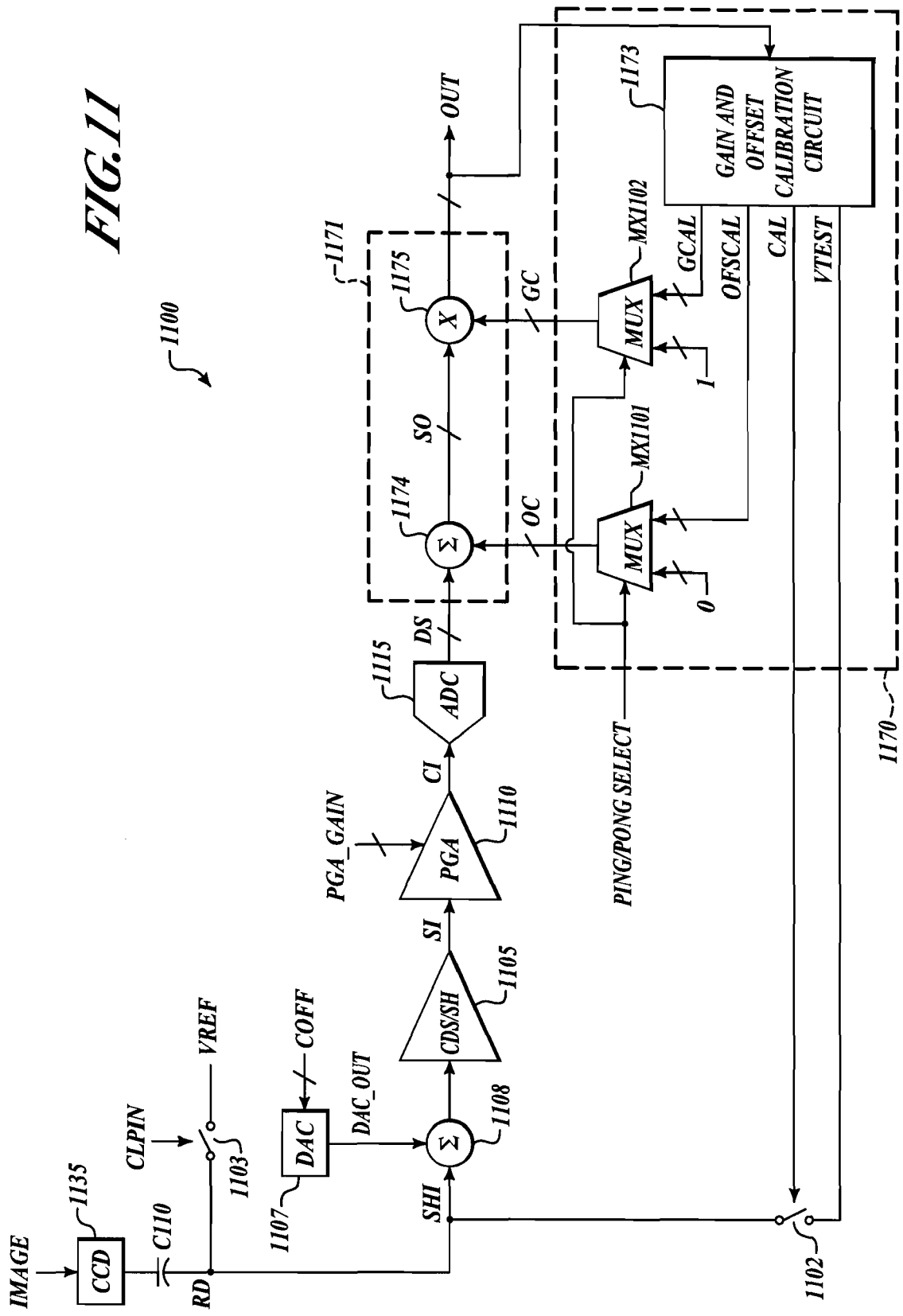
Figure 13:
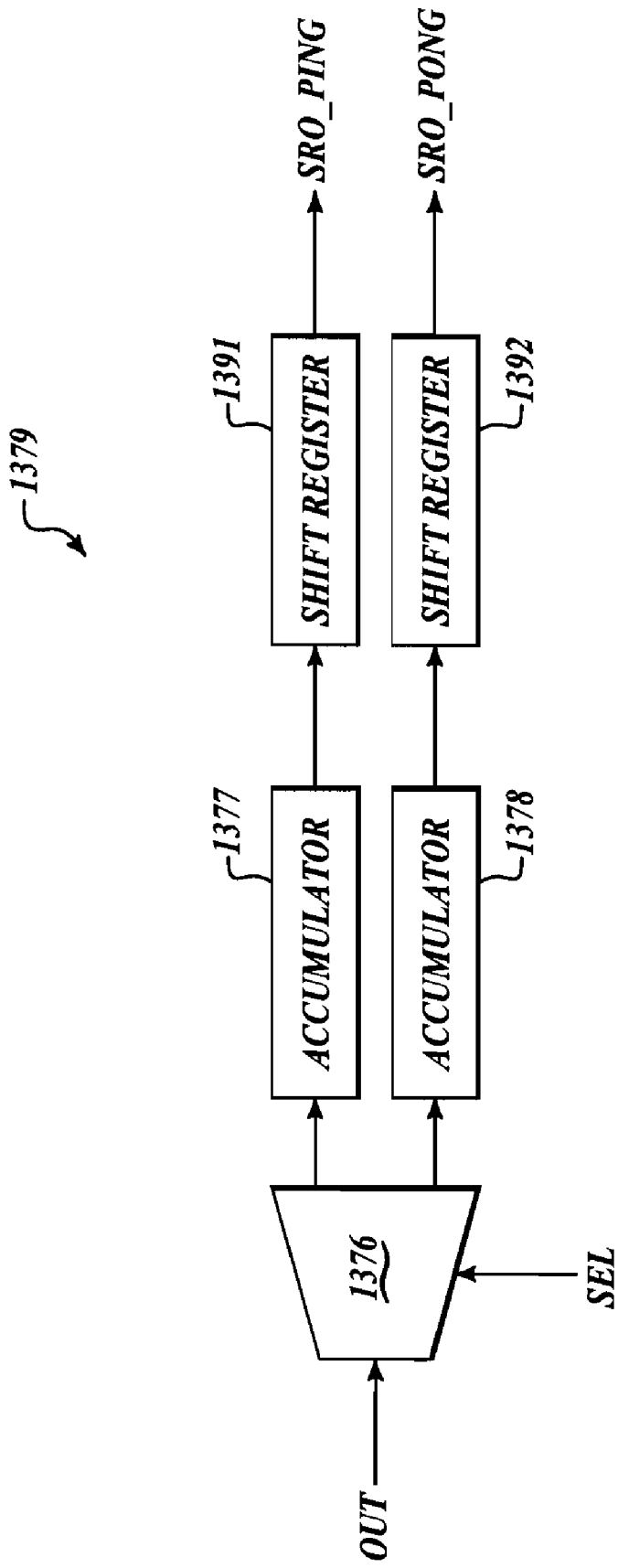
Figure 14:
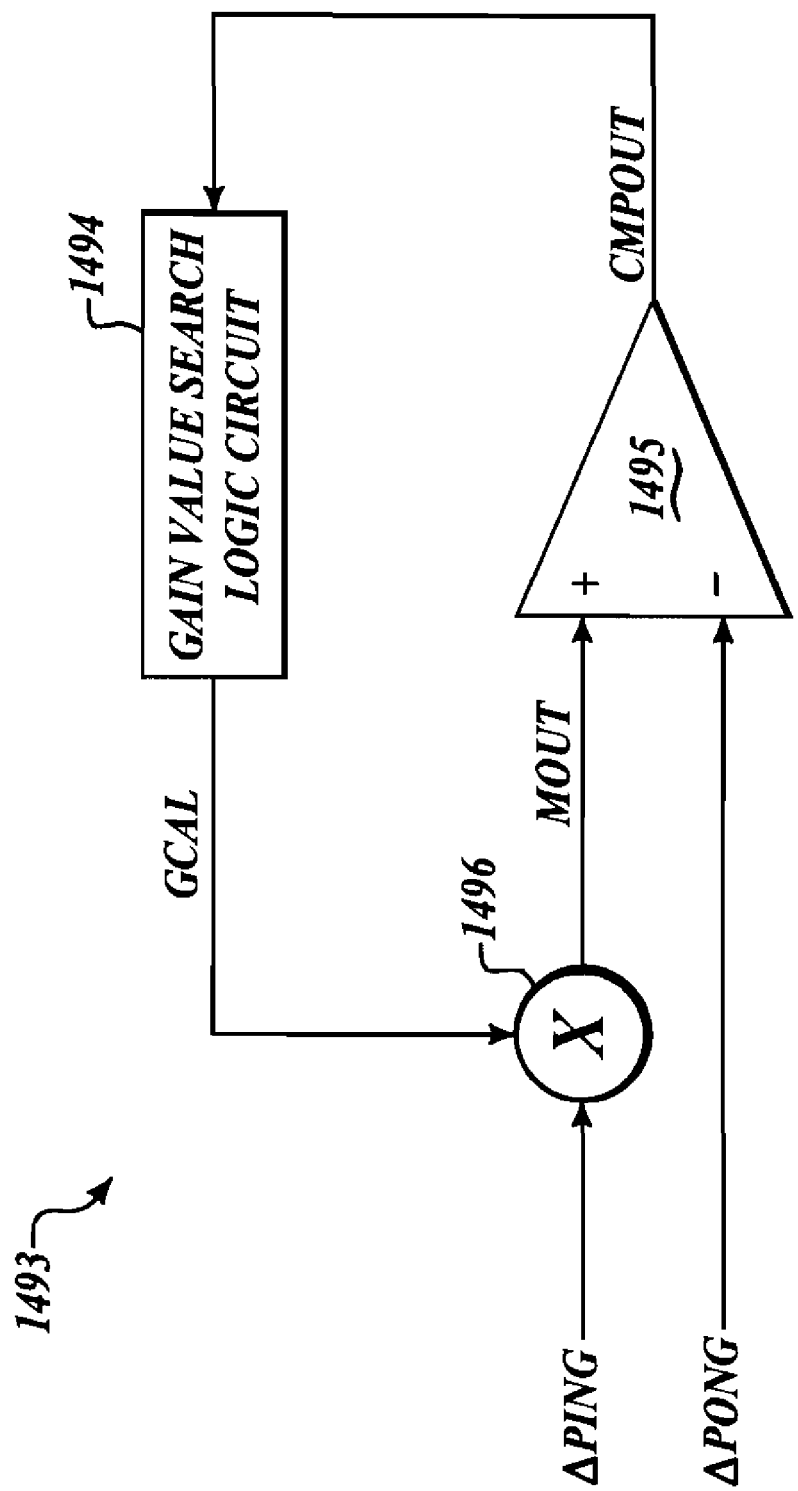

each of FIGS. 5–10 illustrate a timing diagram of the waveform of a different control signal asserted during operation of the correlated double sampler circuit of FIG. 3;

FIG. 11 shows a block diagram of another embodiment of an AFE circuit, a CCD image sensor, and a capacitor;

FIGS. 12a–12h illustrate waveforms of embodiments of signals from the AFE circuit of FIG. 11;

FIG. 13 illustrates a block diagram of an embodiment of a portion of an embodiment of the gain and offset calibration circuit of FIG. 11; and FIG. 14 illustrates a block diagram of an embodiment of another portion of an embodiment of the gain and offset calibration circuit of FIG. 11, arranged in accordance with aspects of the invention.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, the invention is related to an AFE circuit that may include a correlated double sampler (CDS) with a ping-pong architecture, and a ping-pong mismatch correction circuit. The CDS employs a ping data path during ping phases, and employs a pong data path during pong phases. The ping-pong mismatch correction circuit is arranged to correct a mismatch between a gain that is associated with the ping data path and a gain that is associated with the pong data path. Further, the ping-pong mismatch correction circuit is arranged to correct a mismatch between an offset that is associated with the ping data path and an offset that is associated with the pong data path.

In one embodiment, the AFE circuit performs both ping-pong mismatch calibration and black-level calibration. The term "black-level calibration" as used herein refers to black-level calibration, white-level calibration, and the like, so that it may be clearly distinguished by the reader from ping-pong mismatch calibration. The black-level calibration may include analog (coarse) and digital (fine) gain correction, as well as analog (coarse) and digital (fine) offset correction, as explained in greater detail below.

Overview of an Embodiment of an AFE Circuit

Figure 1:
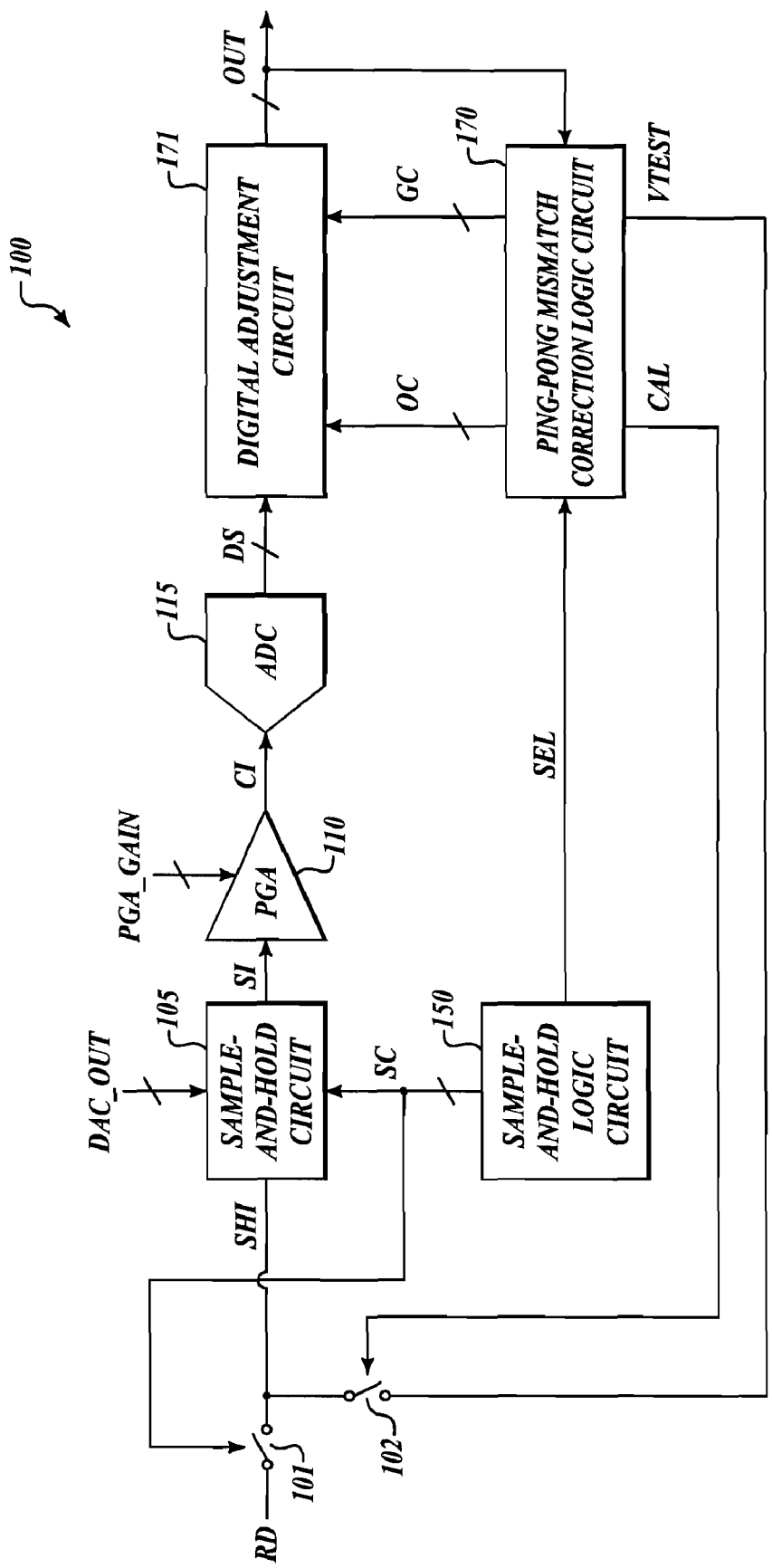
FIG. 1 shows a block diagram of an embodiment of an analog front end (AFE) circuit that includes a ping-pong mismatch correction logic circuit.

FIG. 1 shows a block diagram of an embodiment of AFE circuit 100. AFE circuit 100 includes switch circuits 101 and 102, sample-and-hold circuit 105, sample-and-hold logic circuit 150, PGA 110, ADC 115, digital adjustment circuit 171, and ping-pong mismatch correction logic circuit 170. Although a single-ended embodiment is illustrated in FIG. 1, embodiments of AFE circuit 100 may be single-ended or differential.

Switch circuits 101 and 102 are controlled such that switch circuits 101 and 102 are not simultaneously closed. Switch circuit 101 is controlled by one or more of switch control signals SC. Switch circuit 102 is opened and closed responsive to signal CAL. If switch circuit 101 is closed, sample-and-hold input signal SHI corresponds to raw data signal RD. If switch circuit 102 is closed, signal SHI corresponds to test signal Vtest. Although not shown in FIG.

1, in one embodiment, one or more additional switches may be coupled to provide signal SHI, such as switch 1103 of FIG. 11 below.

Sample-and-hold circuit 105 is arranged to provide sampled image signal SI from sample-and-hold input signal SHI. Sample-and-hold circuit 105 includes a "ping-pong" architecture. In one embodiment, during normal operation, sample-and-hold logic circuit 150 is arranged to provide signals SC such that different sampling and holding capacitors are employed for even pixels than for odd pixels. (An embodiment of sample-and-hold circuit 150 is described in greater detail below in the section entitled "Detailed explanation of an embodiment of a CDS with a ping-pong architecture".) Accordingly, sample-and-hold circuit 105 may be referred to as alternating between "ping" phases and "pong" phases for alternating pixels. The data path employed by sample-and-hold circuit 105 during ping phases (the "ping data path") is different from the data path employed by sample-and-hold circuit 105 during the pong phases (the "pong data path"). Because the ping data path includes different capacitors than the pong data path, mismatch between capacitors may cause different gain and offset coefficients between the ping and pong data path. Referring briefly to FIG. 2A, the ping and pong data paths are illustrated as providing different gain and offset coefficients.

Referring back to FIG. 1, based, in part, on switch control signals SC, sample-and-hold circuit 105 is arranged to provide signal SI from signal SHI employing a ping data path during ping phases, and employing a pong data path during pong phases.

In one embodiment, sample-and-hold circuit 105 is a CDS circuit may employ a reset level provided as part of raw data signal RD, as explained in greater detail below. In another embodiment, sample-and-hold circuit 105 may receive the reset level from a reset signal from a DC voltage that is provided as signal SHI by a switch (such as switch 1103 of FIG. 11 below).

Sample-and-hold logic circuit 150 may also be arranged to provide ping/pong select signal Se1 such that the logic level of signal Se1 indicates whether a ping phase or a pong phase is occurring. In one embodiment, sample-and-hold circuit 105 includes a correlated double sampler circuit having a ping-pong architecture, as described in more detail below.

PGA 110 may be arranged to amplify or attenuate signal SI based on signal PGA_gain to provide signal CI. Also, ADC 115 may be arranged to convert signal CI into a digital signal, digital image signal DS. PGA 110 may be employed to adjust the amplitude of signal CI to match the input signal level to the full signal range of ADC 115.

As previously discussed, the pong data path in sample-and-hold circuit 105 has a different gain and a different offset than the ping data path in sample-and-hold circuit 105. Accordingly, if the signal levels of signal SHI have the same amplitude during the ping and pong phases, signal DS changes when a ping phase changes to a pong phase, and vice versa.

Digital adjustment circuit 171 is arranged to provide digital output signal OUT from signal DS by providing an offset and a gain to signal DS. The offset provided by digital adjustment circuit 171 is controlled by offset control signal OC, and the gain provided by digital adjustment circuit 171 is controlled by gain control signal GC.

If an AFE circuit does not employ ping-pong mismatch correction, but does include digital (fine) gain and offset correction as part of a black-level auto-calibration routine, a digital adjustment circuit (such as digital adjustment circuit 171) may be included in the AFE circuit to perform the digital (fine) gain and offset correction. However, in circuit 100, digital adjustment circuit 171 may also be employed for ping-pong mismatch correction. Therefore, circuit 100 may perform ping-pong mismatch correction without requiring any additional circuitry (apart from ping-pong mismatch correction logic circuit 170).

Embodiments of ping-pong mismatch correction circuit 170 are described in greater detail below. Briefly, however, ping-pong mismatch correction circuit 170 is arranged to provide signals OC and GC, based, in part, on signal Se1, a gain value, and an offset value. Ping-pong mismatch correction circuit 170 is further arranged to determine the gain value and the offset value during a calibration phase. During the calibration phase, ping-pong mismatch correction logic circuit asserts signal CAL so that signal Vtest is sampled by sample-and-hold circuit 105. One or more voltages may be used for signal Vtest during the calibration phase. The gain and offset value are determined such that, during the normal operation, if the signal levels have the same amplitude during the ping and pong phases, signal OUT during the ping phases is substantially the same as signal Out during the pong phases. Accordingly, ping-pong mismatch is substantially corrected in signal OUT. In one embodiment, the ping/pong mismatch correction is automatic and transparent to the user.

AFE circuit 100 may be employed in a digital imaging system (not shown), such as a copier, facsimile machine, scanner, and the like. The digital imaging system may provide signal PGA_gain. The digital imaging system may incorporate a black-level auto-calibration routine (e.g., linear search, successive approximation, or other algorithm) that adjusts signal PGA_gain such that the white level amplitude as seen at the output of ADC 115 is very near to the maximum available digital value. Additionally, during the black-level auto-calibration routine, signal DAC_out may be employed for coarse offset correction. The coarse gain and offset correction are employed to optimize the ADC dynamic range. In one embodiment, the black-level auto-calibration routine which provides signal PGA_gain is performed at the beginning of each line.

FIG. 2A illustrates a functional block diagram of an AFE circuit with no ping-pong mismatch correction. As illustrated in FIG. 2A, although there is only one CDS/SH stage, due to mismatch between the capacitors in the ping data path and the capacitors in the pong data path, there are different gain and offset coefficients for the ping data path than there are for the pong data path. Accordingly, without ping-pong mismatch correction, if the signal levels of signal SHI have the same amplitude during the ping and pong phases, signal OUT changes when a ping phase changes to a pong phase, and vice versa.

FIG. 2B illustrates a functional block diagram of an embodiment of an AFE circuit with ping-pong mismatch correction. A preferred embodiment for performing the ping-pong mismatch correction is described below in the section entitled "Detailed explanation of an embodiment of ping-pong mismatch correction." Briefly, however, in one embodiment, during the calibration phase, signal Ofscal is employed to determine the offset value discussed in FIG. 1 above, and signal Gcal is employed to determine the gain value discussed in FIG. 1. The gain and offset values may be determined by employing a search algorithm, and the like. During normal operation, signals Ofscal and Gcal are provided according to the determined offset and gain values, respectively.

In operation, OUT_pong substantially corresponds to:

$$\mathrm{OUT\_pong} = \{[(Vin \times Gpong + Ofspong + DAC\_out) \times PGA\_gain] + zero\} \times 1.0,$$

where OUT_pong corresponds to the value of OUT during the pong phase, Vin corresponds to the voltage of signal SHI, Gpong corresponds to the gain coefficient of the pong data path, and Ofspong corresponds to the offset coefficient for the pong data path. Also, OUT_ping substantially corresponds to:

$$\mathrm{OUT\_ping} = \{[(Vin \times Gping + Ofsping + DAC\_out) \times PGA\_gain] + Ofscal\} \times GCAL,$$

where OUT_ping corresponds to the value of OUT during the ping phase, Gping corresponds to the gain coefficient of the ping data path, Ofsping corresponds to the offset coefficient for the ping data path. In the embodiment shown, Ofscal=0 and Gcal=1 corresponds to no ping/pong correction. The ping/pong mismatch may be substantially given by:

$$\mathrm{OUT\_pong} - \mathrm{OUT\_ping} = \{Ofspong - Ofsping + (Gpong - Gping) \times Vin\} \times PGA\_gain.$$

Because the difference in gain between the ping and pong data paths is caused by capacitor mismatch, GCAL may be approximately one. Accordingly, during ping-pong mismatch calibration, the correction values may be determined as approximately:

$$Ofscal = PGA\_gain \times (Ofspong - Ofsping) \text{ and}$$
$$Gcal = Gpong/Gping.$$

Accordingly, after ping-pong mismatch calibration, OUT_ping is substantially equal to OUT_pong.

Detailed Explanation of an Embodiment of a CDS with a Ping-Pong Architecture

A detailed explanation of an embodiment of a CDS circuit with a ping-pong architecture is described in this section. Further explanation of ping-pong mismatch correction is described in subsequent sections.

FIG. 3 shows a simplified schematic diagram of an embodiment of CDS circuit 305 and switch circuit 301. CDS circuit 305 and switch circuit 301 may be employed as embodiments of sample-and-hold circuit 105 and switch circuit 101 of FIG. 1, respectively. Although a differential embodiment is illustrated in FIG. 3, embodiments of CDS circuit 305 may be single-ended or differential. CDS circuit 305 comprises operational amplifier 320 whose differential output ($SI = SI_P - SI_N$) has a sequence of values, corresponding to a sequence of pixels coupled to CDS input node IN. Each value of the amplifier output is indicative of the difference between a signal level and a reset level associated with one such pixel. CDS circuit 305 and switch circuit 301 also include capacitor and switch circuitry (comprising switches SW1–SW22 and capacitors Cin1–Cin4 and Cf1–Cf4 connected as shown) coupled between CDS input node IN, the differential input of amplifier 320, and the differential output of amplifier 320.

Figures 4A, 4B:
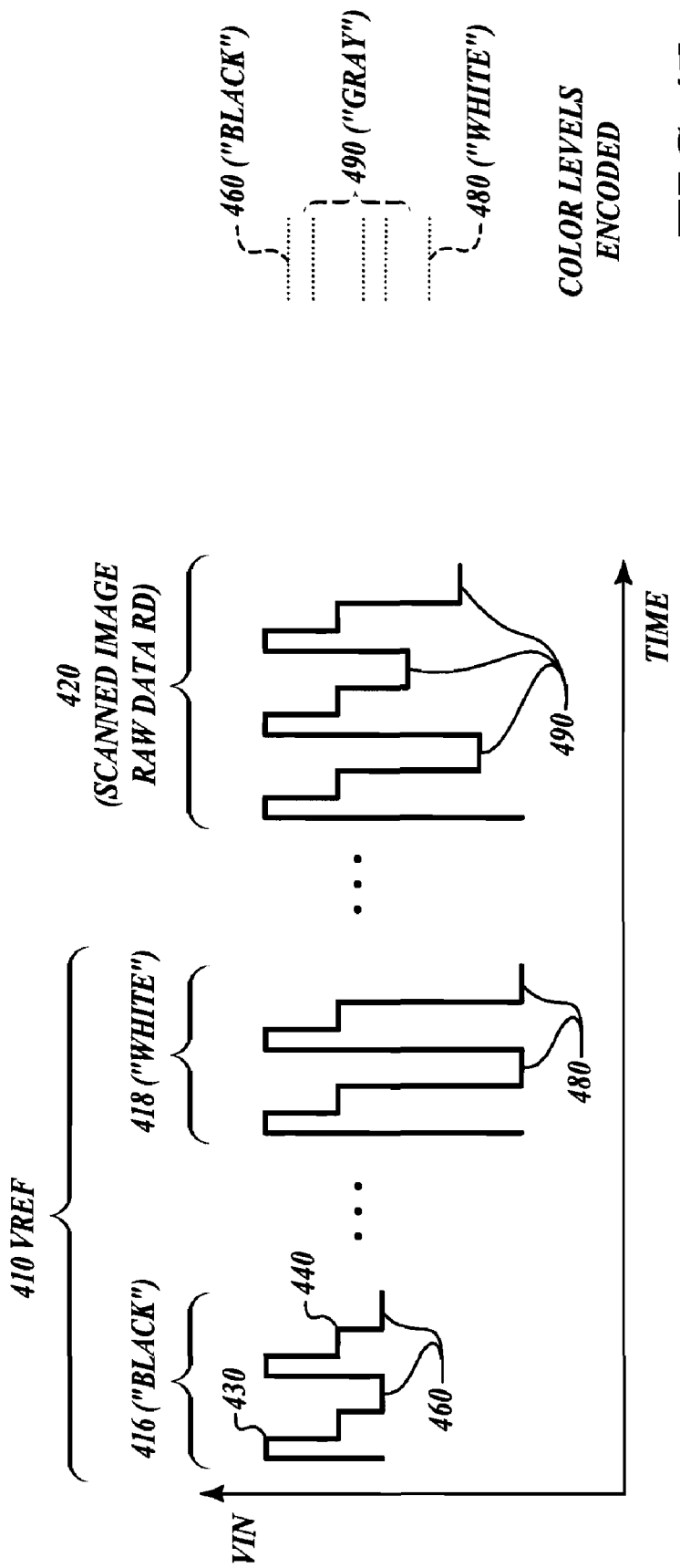
FIG. 4A illustrates a diagram of sample waveforms of signal SHI of FIG. 1 when it performs black-level calibration and when it scans an image.
FIG. 4B illustrates how intensity levels are interpreted from the waveforms of FIG. 4A.
Figure 4C:
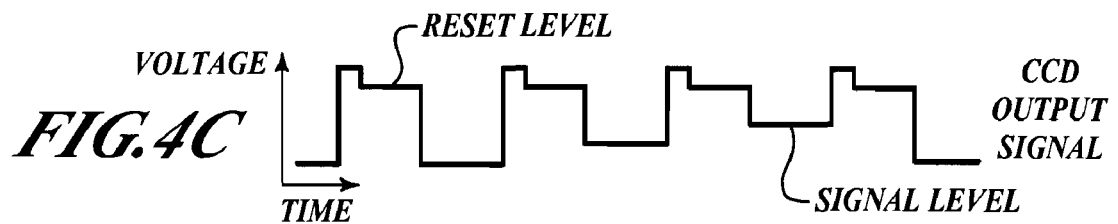
FIG. 4C is shows a timing diagram of the waveform of an embodiment of a raw data signal.

FIG. 4A illustrates sample waveforms generated by a CCD image sensor. During black-level auto-calibration session 410, known reference images Vref are input. During scanning session 420, the image is scanned. The black-level auto-calibration session typically includes a first session 416 when a black reference image is scanned, and second session 418 when a white reference image is scanned to set, for example, the analog and digital gain and the analog and digital offsets for maximum output range.

Waveform SHI includes individual pulses for the pixels of the CCD image sensor. Each pulse includes reset feedthrough section 430, reset level section 440, and then a level that encodes the viewed image intensity. During session 416, the viewed intensity is given by level 460, which corresponds to reference black. During session 418, the viewed intensity is given by level 480, which corresponds to reference white. During session 420, the viewed intensities are given by respective levels 490. Levels 490 generally correspond to gray levels, and are expected to have values mostly between levels 460 and 480. In the embodiment shown, the white pixel voltage levels are more negative than black. In the process of digitization, this polarity sense is "inverted", such that black pixels produce a digitized value that is near the minimum value of the range of the ADC digital output, while white pixels produce a digitized value that is near the maximum value of the range of the ADC digital output.

FIG. 4B illustrates how the intensity levels are interpreted from the waveforms of FIG. 4A. Waveform SHI is received by sample-and-hold circuit 104, which in turn samples and isolates the intensity levels from the remainder of the waveform. During the black-level auto-calibration, sampled intensity levels 460 and 480 are used as reference black and white respectively.

The reference black is set at some output value, and then reference white is mapped near the high end of the dynamic range. PGA 110 of FIG. 1 thus allows the relative voltage levels of FIG. 4B to be adjusted for matching the dynamic range of ADC 115 of FIG. 1. Adjustment is accomplished by varying signal PGA_gain, which in turn controls the amount of amplification. Varying may include a successive approximation routine (SAR), until the reference white is mapped near the high end of the dynamic range. Also, signal DAC_out may be varied for coarse offset correction.

Figure 5:
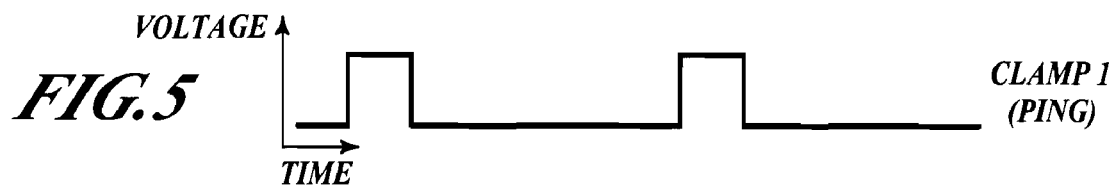
Figure 6:
Figure 7:
Figure 8:
Figure 9:
Figure 10:

Each of FIGS. 4C and 5–10 is a diagram of the waveform of embodiments of switch control signals SC during operation of an embodiment of CDS circuit 305 and switch circuit 301 of FIG. 3. FIG. 5 is a diagram of the waveform of switch control signal C1 ("Clamp 1") asserted during operation of CDS circuit 305 of FIG. 3, FIG. 6 is a diagram of the waveform of switch control signal S1 ("Sample 1") asserted during operation of CDS circuit 305 of FIG. 3, FIG. 7 is a diagram of the waveform of switch control signal H1 ("Hold 1") asserted during operation of CDS circuit 305 of FIG. 3, FIG. 8 is a diagram of the waveform of switch control signal C2 (Clamp 2) asserted during operation of CDS circuit 305 of FIG. 3, FIG. 9 is a diagram of the waveform of switch control signal S2 (Sample 2) asserted during operation of CDS circuit 305 of FIG. 3, and FIG. 10 is a diagram of the waveform of switch control signal H2 (Hold 2) asserted during operation of CDS circuit 305 of FIG. 3.

With reference to FIG. 3, signal RD is asserted at CDS input node IN from a CCD image sensor (not shown in FIG. 3). Preferably, capacitors Cf1 and Cf2 have identical capacitances and capacitors Cin1 and Cin2 have identical capacitances. Switches SW1, SW2, SW3, SW4, SW5, SW6, SW7, SW8, SW9, SW10, SW11, SW12, SW13, SW14, SW15, SW16, SW17, SW18, SW19, SW20, SW21, and SW22 are controlled by switch control signals S2, S1, C1, C2, H1, H2, S1, C1, S2, C2, H2, H1, H1, H2, H2, H1, H1, H2, H1, H2, H2, and H1 respectively. The switch controls signals are an embodiment of switch control signals SC of FIG. 1.

In correlated double sampling operation, signals S1, S2, C1, C2, H1, and H2 initially have values which open all of switches SW1, SW2, SW3, SW4, SW5, SW6, SW7, SW8, SW9, SW10, SW11, SW12, SW13, SW14, SW15, SW16, SW17, SW18, SW19, and SW22. Then, a rising edge of signal CI causes switches SW3 and SW8 to close. In response to the rising edge of signal C1, a sample of input signal at CDS input node IN (indicative of the reset level of a first pixel) is sampled onto capacitor Cin1 while the right plate of Cin1 is held at a constant voltage (cmi). At the same time, the left plate of feedback capacitor Cf1 is held at the constant voltage (cmi) while its right plate is held at another constant voltage (cmo). Signal C1 then falls low, and the voltages on capacitors Cin1 and Cf1 are retained.

Then, a rising edge of signal S1 causes switches SW2 and SW7 to close. In response to the rising edge of signal S1, a sample of input signal at CDS input node IN (indicative of the signal level of the first pixel) is sampled onto the left plate of capacitor Cin2 while the right plate of capacitor Cin2 is held at the constant voltage, cmi. At the same time, the left plate of feedback capacitor Cf2 is connected to the constant voltage cmi, while its right plate is held at the other constant voltage (cmo). Signal S1 then falls low, and the voltages on capacitors Cin2 and Cf2 are retained.

Then, a rising edge of signal H1 causes switches SW5, SW12, SW13, SW16, SW17, SW19, and SW22 to close. In response to the rising edge of signal H1, the right plates of capacitors Cin1 and Cin2 are connected to the input nodes of operational amplifier 320 (which is a differential amplifier) and the left plates of capacitors Cin1 and Cin2 are shorted together. At the same time, feedback capacitors Cf1 and Cf2 are connected between the input and output nodes of operational amplifier 320. Since charge must be conserved, and since the right plates of capacitors Cin1 and Cin2 and the left plates of capacitors Cf1 and Cf2 remain at the voltage level cmi, the difference between the output nodes of operational amplifier 320 must equal the difference between the reset level and the signal level of the first pixel, assuming that the capacitances are equal (i.e., Cin1=Cin2=Cf1=Cf2).

After the falling edge of signal S1, a rising edge of signal C2 causes switches SW4 and SW10 to close. In response to the rising edge of signal C2, a sample of input signal at CDS input node IN (indicative of the reset level of a second pixel) is sampled onto capacitor Cin3 while the right plate of Cin3 is held at the constant voltage (cmi). At the same time, the left plate of feedback capacitor Cf3 is held at the constant voltage (cmi) while its right plate is held the other constant voltage (cmo).

After the falling edge of signal C2, a rising edge of signal S2 causes switches SW1 and SW9 to close. In response to the rising edge of signal S2, a sample of input signal at CDS input node IN (indicative of the signal level of the second pixel) is sampled onto the left plate of capacitor Cin4 while the right plate of capacitor Cin4 is held at the constant voltage, cmi. At the same time, the left plate of feedback capacitor Cf4 is connected to the constant voltage cmi, while its right plate is held at the other constant voltage (cmo).

Then, a rising edge of signal H2 causes switches SW6, SW11, SW14, SW15, SW18, SW20, and SW21 to close, and a falling edge of signal H1 causes switches SW5, SW12, SW13, SW16, SW17, SW19, and SW22 to open. In response to these transitions of signals H1 and H2, the right plates of capacitors Cin3 and Cin4 are connected to the input nodes of operational amplifier 320 and the left plates of capacitors Cin3 and Cin4 are shorted together. At the same time, feedback capacitors Cf3 and Cf4 are connected between the input and output nodes of operational amplifier 320 (and capacitors Cf1 and Cf2 are disconnected from the input and output nodes of operational amplifier 320). Since charge must be conserved, and since the right plates of capacitors Cin3 and Cin4 and the left plates of capacitors Cf3 and Cf4 remain at the voltage level cmi, the difference between the output nodes of operational amplifier 320 must equal the difference between the reset level and the signal level of the second pixel, assuming that the capacitances are equal (i.e., Cin3=Cin4=Cf3=Cf4).

Thus, the differential output $(SI_P-SI_N)=SI$ of operational amplifier 320 progresses from one difference signal to the next as the clocks H1 and H2 alternate (180 degrees out of phase with respect to each other) in an odd/even pixel sequence herein referred to as "ping-pong". As previously discussed, if signal levels of signal RD have the same amplitude during the ping and pong phases, signal SI during the ping phases is different than signal SI during the pong phases due to mismatch between capacitors in the ping data path and capacitors in the pong data path.

The embodiment of CDS circuit 305 illustrated in FIG. 3 has a continuous differential output, in the sense that the differential output $(SI_P-SI_N)=SI$ of operational amplifier 320 does not periodically return to zero, as do some configurations of sample-and-hold circuitry.

Overview of Another Embodiment of an AFE with Ping-Pong Mismatch Correction

FIG. 11 shows a block diagram of AFE circuit 1100, CCD image sensor 1135, and capacitor C110. Components in AFE circuit 1100 may operate in a substantially similar manner to similarly-named components in AFE circuit 100 of FIG. 1, and may operate in a different manner in some ways. Although a single-ended embodiment is illustrated in FIG. 11, embodiments of AFE circuit 1100 may be single-ended or differential. AFE circuit 1100 further includes DAC 1107 and switch circuit 1103. Also, analog adder 1108 is shown as a separate component in FIG. 11 for illustrative purposes, although it may be part of sample-and-hold circuit 1105. Digital adjustment circuit 1171 includes digital adder 1174 and digital multiplier 1175. Ping-pong mismatch correction circuit 1170 includes multiplexers 1101–1102, and gain and offset calibration circuit 1173.

Signal Vref provides a voltage that corresponds to a black level. In one embodiment, signal C1pin is asserted during at the beginning of each scan line to substantially charge signal SHI to Vref.

When signal C1pin is asserted, switch circuit 1103 turns on so that signal Vref, rather than signal RD, is provided as signal SHI. DAC 1107 is arranged to convert digital signal Coff to analog signal DAC_out. Analog adder circuit 1145 is arranged to add signal DAC_out to signal SHI.

Additionally, digital adder circuit 1174 is arranged to add signals DS and OC to provide sum output signal SO. Digital multiplier circuit 1175 is arranged to multiply signals SO and GC to provide signal OUT.

Gain and offset calibration circuit 1173 is arranged to receive signal OUT, and to provide offset calibration signal Ofscal, gain calibration signal Gcal, test signal Vtest, and signal CAL. Further, gain and offset calibration circuit 1173 is arranged to determine and store the gain and offset values discussed in FIG. 1 above. During the calibration phase, gain and offset calibration circuit 1173 employs signal Ofscal to determine the offset value, and employs signal Gcal to determine the gain value. The gain and offset values may be determined by employing a search algorithm, and the like. During normal operation, gain and offset calibration circuit 1173 provide signals Ofscal and Gcal according to the determined offset and gain values, respectively.

Also, multiplexer circuit MX1101 is arranged to provide signal OC by multiplexing a signal having a value of "0"

with signal Ofscal, based on ping/pong select signal Se1. Similarly, multiplexer circuit MX1102 is arranged to provide signal GC by multiplexing a signal having a value of "1" with signal Gcal, based on signal Se1. As previously discussed, in one embodiment, signal Se1 is 0 during the ping phase, and 1 during the pong phase.

FIG. 11 illustrates an embodiment of ping-pong mismatch correction logic circuit 1170 in which offset and gain values are provided by determining the offset and gain that are appropriate to apply to signal OUT during ping phases in order to substantially match signal OUT during pong phases. However, in other embodiments, offset and gain values may be provided by determining the offset and gain that are appropriate to apply to signal OUT during pong phases in order to substantially match signal OUT during ping phases, or the like.

In one embodiment, the ping-pong mismatch calibration performed by ping-pong mismatch correction logic circuit 1170 is performed once, during power-up of AFE circuit 1100. There is no need to recalibrate the offset value during operation. However, if signal PGA_gain is changed, the offset value may not be accurate. In one embodiment, the calibration is repeated if signal PGA_gain is changed. In another embodiment, the offset value is updated each time signal C1pin is asserted. In this embodiment, signal Vref may be employed for calibrating the offset value rather than signal Vtest.

Embodiments of gain and offset calibration circuit 1173 are described below. However, other embodiments are within the scope and spirit of the invention.

In one embodiment, gain and offset calibration circuit 1173 is arranged to determine the gain value as follows. Gain and offset calibration circuit 1173 determines and stores a ping value that is based, in part, on signal OUT during one of the ping phases, and also determines and stores a pong value that is based, in part, on signal OUT during one of the pong phases. Preferably, the ping value is based on signal OUT averaged over several ping phases, and the pong value is based on signal OUT over several pong phases. The averaging may help filter out noise and other spurious effects. Also, the gain value may be calculated based on two different voltages for Vtest—Vin1 and Vin2—and determining the gain value appropriate to cause the difference (Δping) in ping values of the two voltages and the difference (Δpong) in pong values over the two voltages to be equal. The gain value may be determined by employing a search algorithm such as a binary search algorithm, and the like.

Preferably, to prevent saturation of the output signal (e.g. signal DS of FIG. 11) of the ADC (e.g. ADC 1115 of FIG. 11), voltages Vin1 and Vin2 are selected so the input signal (e.g. signal CI of FIG. 11) of the ADC is substantially within the dynamic range of the ADC.

In one embodiment, gain and offset calibration circuit 1173 is arranged to provide signal Ofscal according to pong−Gcal*ping, where pong is based on the value of signal OUT during a pong phase, and ping is based on a value of signal OUT during a ping phase. For this equation, it is assumed that Gcal is approximately equal to one, as discussed above. Preferably, the values of pong and ping may be based on average values of OUT over several pong and ping phases, respectively.

Figure 12A:
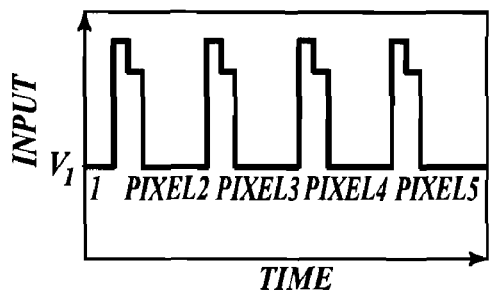
Figure 12E:
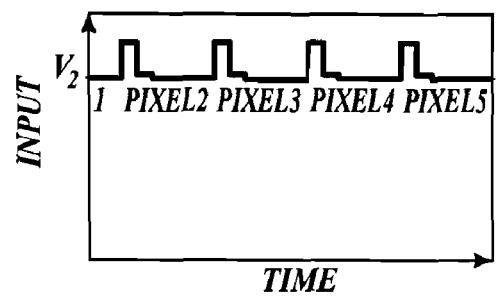
Figure 12B:
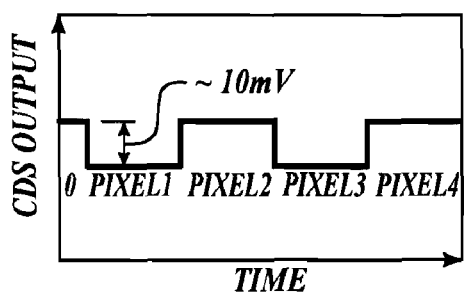
Figure 12F:
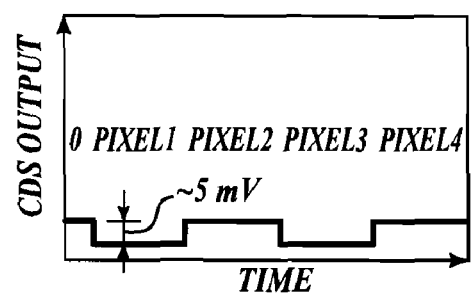
Figure 12C:
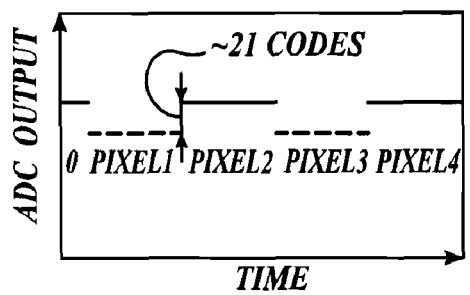
Figure 12G:
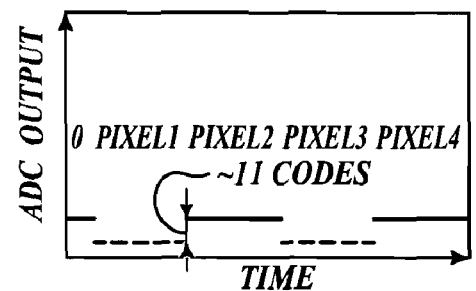
Figure 12D:
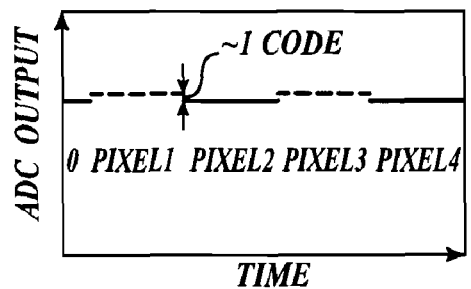
Figure 12H:
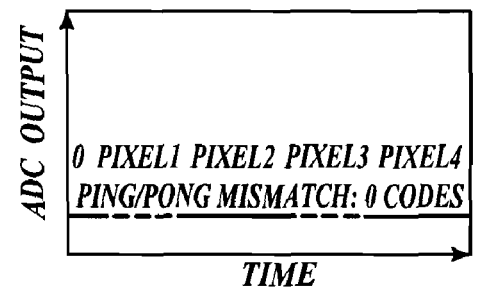

FIG. 12a illustrates a waveform of an embodiment of a raw data signal RD1 that corresponds to a first level of illumination across several pixels, and FIG. 12e illustrates a waveform of an embodiment of a raw data signal RD2 that corresponds to a second level of illumination across several pixels. FIG. 12b shown a waveform of an embodiment of a CDS output signal (e.g. signal SI) based on signal RD1, and FIG. 12f shows a waveform of an embodiment of a CDS output signal based on signal RD2. FIG. 12c illustrates a waveform of an embodiment of an ADC output signal (e.g. signal DS) based on signal RD1, and FIG. 12g illustrates a waveform of an embodiment of an ADC output signal based on signal RD2. FIG. 12d illustrates a waveform of an embodiment of a corrected output signal (e.g. signal OUT) based on signal RD1, and FIG. 12h illustrates a waveform of an embodiment of a corrected output signal based on signal RD2.

Raw data signal RD1 of FIG. 12a has a first voltage level, and raw data signal RD2 has another voltage level. As illustrated in FIG. 12b, even though each pixel provided a signal corresponds to the same illumination level, the CDS output changes between the ping and pong phases. For the waveform shown in FIG. 12b, the difference is approximately 10 mV. For the waveform shown in FIG. 12f, the difference is approximately 5 mV. As illustrated in FIG. 12c, the ping/pong mismatch results in different ADC outputs between the ping and pong phases. For the waveform illustrated in FIG. 12c, the difference is approximately 21 codes (i.e. 21 least significant bits). For the waveform illustrated in FIG. 12g, the difference is approximately 11 codes (e.g. 11 least significant bits).

The gain and offset values are determined during ping-pong mismatch calibration, and the determined gain and offset values are provided by signals Ofscal and Gcal during normal operation. In one embodiment, the offset value is determined as 11 (least significant bits), and the gain value is determined as 1.003.

As illustrated in FIGS. 12d and 2h, during normal operation, signal OUT is substantially corrected for ping/pong mismatch. In the waveform illustrated in FIG. 12d, a ping-pong mismatch of one code remains due to rounding errors.

Detailed Explanation of an Embodiment of Ping-Pong Mismatch Correction

FIG. 13 illustrates a block diagram of an embodiment of portion 1379 of an embodiment of a gain and offset calibration circuit. Portion 1379 includes de-multiplexer 1376, accumulators 1377 and 1378, and shift registers 1391 and 1392. Portion 1379 is a portion of one embodiment of gain and offset calibration circuit 1173 of FIG. 11.

During the calibration phase, reference voltage Vin1 is employed as signal Vtest during N ping stages and N pong stages so that signal OUT is based on voltage Vin1 during N ping and pong stages. Accumulator 1377 stores the sum of values for signal OUT during N ping phases, and accumulator 1378 stores the sum of value for signal OUT during N pong phases. Preferably, N is a multiple of 2. This way, division of the accumulated values may be performed by shift registers 1391 and 1392. After the N ping and pong phases, shift register 1391 provides signal SRO_ping such that signal SRO_ping corresponds to the average of the values of signal OUT during the N ping phases that voltage Vin1 is employed. Similarly, shift register 1392 provides signal SRO_pong such that signal SRO_pong corresponds to the average of the values of signal OUT during the N pong phases that voltage Vin1 is employed. The gain and calibration circuit stores signals SRO_ping and SRO_pong as accumulated ping value A and accumulated pong value B, respectively.

Preferably, Coff is set to zero during the calibration phase, but it is not necessary to do so. If Coff is small compared to the Gcal during the calibration, the calibration may be more accurate.

Accumulated ping value "A" may be substantially given by Σ(Gping*Vin1+Coff+Ofsping)*PGA_gain/N, wherein Gping is the gain associated with the ping data path, and Ofsping is the offset associated with the ping data path. Similarly, accumulated pong value "B" may be substantially given by Σ(Gpong*Vin1+Coff+Ofspong)*PGA_gain/N, wherein Gpong is the gain associated with the pong data path, and Ofspong is the offset associated with the pong data path.

Next, the above process is repeated using another reference voltage Vin2, storing signals SRO_ping and SRO_pong as C and D respectively. Accordingly, the gain and offset calibration circuit stores C as the sum of the values of signal OUT during the N ping phases that voltage Vin2 is employed, and stores D as the sum of the values of signal OUT during the N pong phases that voltage Vin2 is employed.

The gain and offset calibration circuit then stores Δping as C–A, and stores Δpong as D–B. Accordingly, Δping may be substantially given by Σ[Gping*(Vin2–Vin1)]* PGA_gain/N, and Δpong may be substantially given by Σ[Gpong*(Vin2–Vin1)]*PGA_gain/N. The gain and offset calibration circuit then determines Gcal based on Δping and Δpong. Gcal may be determined by employing a search algorithm, and the like.

FIG. 14 shows a block diagram of an embodiment of another portion 1493 of an embodiment of a gain and offset calibration circuit. In one embodiment, gain and offset calibration circuit 1173 includes portion 1379 and portion 1493. Portion 1493 may include digital multiplier 1496, comparator 1495, and gain value search logic circuit 1494. In one embodiment, rather than employing a separate digital multiplier, a digital multiplier that is already included in the AFE (e.g. digital multiplier 1174 of FIG. 11) may be used rather than employing two separate digital multipliers. Portion 1493 is a preferred architecture for determining the gain value because it employs minimal digital circuitry.

Digital multiplier 1496 is arranged to provide signal Mout such that signal Mout is substantially given by Δping*Gcal. Additionally, comparator 1495 is arranged to provide signal CMPout based on a comparison of signals Mout and Δpong. Gain value logic circuit 1494 is arranged to provide signal Gcal. Further, gain value logic circuit 1494 is arranged to determine the gain value based on a search algorithm such as a binary search algorithm, a successive approximation algorithm, and the like. Gain value search logic circuit 1494 may employ signal CMPout for the algorithm, iteratively increasing or decreasing Gcal based on the logic level of signal CMPout.

When the algorithm is complete, signal Gcal corresponds to the determined gain value, so that Gcal*Δping is substantially equal to Δpong.

In one embodiment, after Gcal has been determined, Ofscal may be determined as B–Gcal*A. The multiplication of Gcal and A may be performed by digital multiplier 1496.

In one embodiment, the digital imaging system may perform both coarse and fine calibration during the black-level auto-calibration routine. During the black-level auto-calibration routine, the digital imaging system determines analog (coarse) and digital (fine) gain, and analog (coarse) and digital (fine) offset. The fine gain used for ping phases is Gcal*(the fine gain value determined during the black-level auto-calibration routine). The fine gain used for the pong phases is (the fine gain value determined during the black-level auto-calibration routine). The fine offset used for the ping phases is (the fine offset value determined during the black-level auto-calibration routine)+Ofscal. The fine offset used for the pong phases is (the fine offset value determined during the black-level auto-calibration routine). In another embodiment, Gcal and Ofscal may be calculated relative to the ping phases rather than relative to the pong phases.

Accordingly, referring to FIG. 11, in one embodiment, multiplexer MX1101 receives (the fine offset value determined during the black-level auto-calibration routine)+Ofscal rather than Ofscal, and multiplexer MX1102 receives Gcal*(the fine gain value determined during the black-level auto-calibration routine) rather than Gcal.

As discussed above, the calculated value for Gcal need not be re-calibrated. However, the value of Ofscal may be inaccurate if the value of PGA_gain is changed. In one embodiment, if PGA_gain is changed, the entire calibration process is repeated. In another embodiment, if PGA_gain is changed, re-calibration is not performed, but the Ofscal value is updated while C1pin is asserted, as described below. As discussed above, in the embodiment in which the Ofscal value is updated while C1pin is asserted, signal Vref may be employed for the calibration rather than signal Vtest.

Portion 1379 of FIG. 13 may be employed to determine and store values E and F such that value E is substantially given by (the sum M ping pixels with Vref input)/M, and such that value F is substantially given by (the sum M pong pixels with Vref input)/M. Although Vref is used one embodiment, in another embodiment, virtually any fixed voltage may be employed. The new value of Ofscal may then be calculated as (the previous value of Ofscal)+F–E. In another embodiment, to smooth out the image and prevent large changes in Ofscal as numbers lines are scanned, the new value of Ofscal may instead by calculated as (the previous value of Ofscal)+(F–E)/X. If X is a multiple of two, a shift register may be used to perform the division. Division by X enables a gradual change in Ofscal as the operation is repeated numerous times and converges to a final value.

After the new value of Ofscal is calculated while C1pin is asserted, the new value of Ofscal is used for all pixels on the line while C1pin is de-asserted. Ofscal may be corrected again when C1pin is asserted again at the start of the next line.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for mismatch correction, comprising:
  a sample-and-hold logic control circuit that is arranged to provide a ping/pong select signal such that the ping/pong select signal corresponds to a first logic level during ping phases and corresponds to a second logic level during pong phases, and further arranged to provide a plurality of switch control signals, wherein the sample-and-hold logic circuit alternates between the ping phases and the pong phases during a normal operation;
  a ping-pong sample-and-hold circuit that includes a ping data path and a pong data path, wherein the ping-pong sample-and-hold circuit is arranged to provide a sampled image signal, based, in part, on a sample-and-hold input signal and the plurality of switch control signals such that the ping data path is employed during the ping phases and the pong data path is employed during the pong phases;

an analog-to-digital converter circuit that is arranged to provide a digital image signal from a conversion input signal that is based, in part, on the sampled image signal;

a digital adjustment circuit that is arranged to provide a digital output signal from the digital image signal by providing an offset and a gain to the digital image signal such that the offset is based on an offset control signal, and the gain is based on a gain control signal; and a ping-pong mismatch correction circuit that is arranged to provide the offset control signal and the gain control signal, based, in part, on the ping/pong select signal, a gain value, and an offset value; and further arranged to determine the gain value and the offset value during a calibration phase such that, during the normal operation the digital output signal is substantially corrected for a mismatch between the ping and pong data paths.

2. The circuit of claim 1, further comprising a programmable gain amplifier that is arranged to provide the conversion input signal based on the sampled image signal.

3. The circuit of claim 1, wherein the digital adjustment circuit includes:
   a summing circuit that is arranged to provide a summing output signal such that the summing output signal corresponds to a sum of the sampled image signal and the offset control signal; and
   a multiplying circuit that is arranged to provide the digital output signal such that the digital output signal corresponds to a multiplicative product of the sum output signal and the gain control signal.

4. The circuit of claim 1, wherein the ping-pong sample-and-hold circuit includes a ping-pong correlated double sampler circuit, and wherein the ping-pong correlated double sampler circuit includes:
   a sampler input node coupled to receive the raw data signal;
   a voltage reference level clamp that is arranged to receive a black-level signal, wherein the voltage clamp is coupled to the sampler input node;
   a first amplifier having two input terminals and two output terminals; and
   switch and capacitor circuitry comprising switches and capacitors, wherein the switch and capacitor circuitry is coupled between the sampler input node, the input terminals of the first amplifier, and the output terminals of the first amplifier; the switch and capacitor circuitry is coupled to receive a first set of control signals followed by a second set of control signals during each cycle of operation of the correlated double sampler circuit; and wherein the switch and capacitor circuitry is configured to operate cyclically during processing of the raw data signal such that a portion of the image signal generated in response to the first set of control signals is indicative of the value of one pixel of the image and a subsequent portion of the image signal generated in response to the second set of control signals is indicative of the value of a next pixel of the image.

5. The circuit of claim 1, wherein the ping-pong mismatch correction circuit includes:
   a gain and offset mismatch calibration circuit that is arranged to determine the gain value during the calibration phase; to store the gain value; to determine the gain value during the calibration phase after the gain value is determined; and further arranged to store the offset value.

6. The circuit of claim 5, wherein the ping-pong mismatch correction circuit further includes:
   a first multiplexer circuit that is arranged to provide the offset control signal by multiplexing the offset value and another signal, wherein the multiplexing of the first multiplexer circuit is based on the ping/pong select signal;
   a second multiplexer circuit that is arranged to provide the gain control signal by multiplexing the gain signal and yet another signal such that the multiplexing of the second multiplexer circuit is based on the ping/pong select signal.

7. The circuit of claim 5, wherein the gain and offset mismatch calibration circuit is configured to determine the gain value by employing a search algorithm on a plurality of test gain values to determine the gain value.

8. The circuit of claim 5, wherein the gain and offset mismatch calibration circuit is configured to determine the gain and offset values by performing actions, including:
   determining and storing a ping value that is based, in part, on the digital output signal during one of the ping phases;
   determining and storing a pong value that is based, in part, on the digital output signal during one of the pong phases;
   determining the gain value based, in part, on the ping and pong values; and
   determining the offset value based on a mathematical calculation that includes the ping value, the pong value, and the gain value.

9. The circuit of claim 5, wherein the gain and offset mismatch calibration circuit is further configured to update the offset value during a calibration session, wherein a black-level calibration is performed during the calibration session.

10. The circuit of claim 5, wherein the gain and offset mismatch calibration circuit is configured to determine the gain value by performing actions, including:
    determining and storing a ping value that is based, in part, on the digital output signal during one of the ping phases;
    determining and storing a pong value that is based, in part, on the digital output signal during one of the pong phases; and
    performing a plurality of iterative actions, including:
      providing a test gain value;
      comparing the pong value to a multiplicative product of the ping value and the test gain value; and
      adjusting the test gain value in response to the comparison.

11. The circuit of claim 10, wherein the ping value is based on the difference between a first average ping value and a second average pong value, the first average ping value corresponds to an average of the digital output signal during a first plurality of ping phases in which a first reference voltage is employed as the sampled-and-hold input signal during the first plurality of ping phases, the second average ping value corresponds to an average of the digital output signal during a second plurality of ping phases in which a second reference voltage is employed as the sampled-and-hold input signal during the second of ping phases, the first average pong value corresponds to an average of the digital output signal during a first plurality of pong phases in which a first reference voltage is employed as the sampled-and-hold input signal during the first plurality of pong phases, and wherein the second average pong value corresponds to an average of the digital output signal during a second plurality of pong phases in which a second reference voltage is employed as the sampled-and-hold input signal during the second of pong phases.

12. The circuit of claim 5, wherein the gain and offset mismatch calibration circuit is configured to determine the offset value by performing actions, including:
   determining and storing a ping value that is based, in part, on the digital output signal during one of the ping phases;
   determining and storing a pong value that is based, in part, on the digital output signal during one of the pong phases; and
   determining the offset value by subtracting the pong value from a multiplicative product of the ping value and the gain value.

13. The circuit of claim 12, wherein the ping value is based on an average of the digital output signal during a plurality of ping phases in which a reference voltage is employed as the sampled-and-hold input signal during the plurality of ping phases, and wherein the pong value is based on an average of the digital output signal during a plurality of pong phases in which the reference voltage is employed as the sampled-and-hold input signal during the plurality of pong phases.

14. A method for mismatch correction, comprising:
   employing a ping-pong architecture to provide a sampled image signal such that the sampled image signal is alternatively provided by a ping data path of the ping-pong architecture and a pong data path of the ping-pong architecture;
   employing analog-to-digital conversion to convert a conversion input signal into a digital image signal, wherein the conversion input signal is based, at least in part, on the sampled image signal; and
   correcting a ping-pong mismatch of the digital image signal, wherein the ping-pong mismatch is associated with a difference between: the digital image signal when the ping data path is employed, and the digital image signal when the pong data path is employed, and wherein correcting the ping-pong mismatch includes correcting at least one of ping-pong gain mismatch or ping-pong offset mismatch.

15. The method of claim 14, wherein employing the ping-pong architecture includes:
   providing the sampled image signal by sampling a sample-and-hold input signal with a sample-and-hold circuit that includes the ping-pong architecture, wherein the sample-and-hold input signal is an analog signal; and
   amplifying the sampled image signal based on a programmable gain value to provide the conversion input signal.

16. A method for mismatch correction, comprising:
   employing a ping-pong architecture to provide a digital image signal such that the digital sampled signal is alternatively provided by a ping data path of the ping-pong architecture and a pong data path of the ping-pong architecture; and
   correcting a ping-pong mismatch of the digital image signal, wherein the ping-pong mismatch is associated with a difference between: the digital sampled signal when the ping data path is employed, and the digital sampled signal when the pong data path is employed, wherein correcting the ping-pong mismatch includes:
   providing a digital output signal from the digital image signal by providing an offset and a gain to the digital image signal such that the offset is based on an offset control signal, and the gain is based on a gain control signal;
   providing the offset control signal and the gain control signal, based, in part, on the ping/pong select signal, a gain value, and an offset value; and
   determining the gain value and the offset value during a calibration phase such that, during the normal operation, if the sample-and-hold input signal is has substantially the same signal levels during the ping and pong phases, the digital output signal during the ping phases is substantially the same as the digital output signal during the pong phases.

17. The method of claim 16, wherein providing the digital output signal includes:
   determining a sum by adding a value of the digital signal with a value of the offset control signal; and
   multiplying the sum by a value of the gain control signal.

18. The method of claim 16, wherein determining the gain value and the offset value includes:
   determining the gain value by employing a search algorithm on a plurality of test gain values to determine the gain value.

19. The method of claim 16, wherein determining the gain value and the offset value includes:
   determining the offset value by performing a mathematical calculation that includes the ping value, the pong, value, and the gain value.

20. An apparatus for mismatch correction, comprising:
   means for receiving a sampled signal from a ping-pong architecture, wherein the sampled signal is alternatively provided by a ping data path of the ping-pong architecture and a pong data path of the ping-pong architecture;
   means for converting an analog conversion input signal into a digital signal, wherein the analog conversion input signal is based, at least in part, on the sampled signal; and
   means for correcting a ping-pong mismatch of the digital signal, wherein the ping-pong mismatch is associated with a difference between: the digital signal when the ping data path is employed, and the digital signal when the pong data path is employed, and wherein means for correcting the ping-pong mismatch includes means for correcting at least one of ping-pong gain mismatch or ping-pong offset mismatch.

21. The method of claim 14, wherein the conversion input signal is the sampled image signal.

* * * * *

UNITED STATES PATENT AND TRADEMARK OFFICE
CERTIFICATE OF CORRECTION

| | | |
|---|---|---|
| PATENT NO. | : 7,236,117 B1 | Page 1 of 1 |
| APPLICATION NO. | : 10/894982 | |
| DATED | : June 26, 2007 | |
| INVENTOR(S) | : Varma et al. | |

It is certified that error appears in the above-identified patent and that said Letters Patent is hereby corrected as shown below:

In column 4, line 23, delete "Out" and insert -- OUT --, therefor.

In column 7, line 2, delete "Cl" and insert -- C1 --, therefor.

In column 16, line 17, in Claim 16, after "signal" delete "is".

In column 16, line 37, in Claim 19, after "pong" delete ",".

Signed and Sealed this

Twenty-first Day of August, 2007

JON W. DUDAS
*Director of the United States Patent and Trademark Office*